(12) United States Patent
Houle

(10) Patent No.: US 8,013,439 B2
(45) Date of Patent: Sep. 6, 2011

(54) INJECTION MOLDED METAL STIFFENER FOR PACKAGING APPLICATIONS

(75) Inventor: Sabina J. Houle, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 269 days.

(21) Appl. No.: 12/165,358

(22) Filed: Jun. 30, 2008

(65) Prior Publication Data

US 2009/0321963 A1 Dec. 31, 2009

(51) Int. Cl.
*H01L 23/34* (2006.01)
(52) U.S. Cl. ............... 257/712; 257/773; 257/E23.101
(58) Field of Classification Search .............. 257/727, 257/30, 773, 712, 713, 786, 706, 758, E23.116, 257/E23.101, E23.123, E23.194, 787
See application file for complete search history.

(56) References Cited

U.S. PATENT DOCUMENTS

| | | | |
|---|---|---|---|
| 7,183,140 B2 | 2/2007 | Davison et al. | |
| 7,279,789 B2 * | 10/2007 | Cheng | 257/713 |
| 2002/0017716 A1 * | 2/2002 | Ohtaka et al. | 257/712 |
| 2002/0173077 A1 * | 11/2002 | Ho et al. | 438/113 |
| 2004/0183184 A1 * | 9/2004 | Libous et al. | 257/690 |
| 2007/0121632 A1 * | 5/2007 | Zabarski | 370/392 |
| 2009/0114268 A1 * | 5/2009 | Buller et al. | 136/251 |

OTHER PUBLICATIONS

United States Patent Application, pending—not yet published, U.S. Appl. No. 11/864,279, filed Sep. 28, 2007, to Houle et al.
United States Patent Application, pending—not yet published, U.S. Appl. No. 12/165,374, filed Jun. 30, 2008, to Gealer et al.
United States Patent Application, pending—not yet published, U.S. Appl. No. 12/165,385, filed Jun. 30, 2008, to Houle et al.

* cited by examiner

*Primary Examiner* — A. Sefer
*Assistant Examiner* — Dilinh P Nguyen
(74) *Attorney, Agent, or Firm* — David L. Guglielmi

(57) ABSTRACT

In some embodiments, an injection molded metal stiffener for packaging applications is presented. In this regard, an apparatus is introduced comprising a microelectronic device package substrate, a microelectronic device coupled with a top surface of the package substrate, and an injection-molded, metal stiffener coupled with the package substrate, wherein the stiffener includes a central opening and at least partially surrounds the microelectronic device. Other embodiments are also disclosed and claimed.

14 Claims, 3 Drawing Sheets

US 8,013,439 B2

INJECTION MOLDED METAL STIFFENER FOR PACKAGING APPLICATIONS

FIELD OF THE INVENTION

Embodiments of the present invention generally relate to the field of integrated circuit package design and, more particularly, to an injection molded metal stiffener for packaging applications.

BACKGROUND OF THE INVENTION

As microelectronic components shrink in size, a trend has emerged to provide package substrates that may be characterized as thin core substrates (that is, substrates having a core with a thickness less than or equal to 400 microns and larger than zero), or no-core substrates (that is, substrates without cores).

Disadvantageously, with a thin or no-core substrate, however, decrease in yield at first level chip attach due to warpage causing nonwets may occur during the package manufacturing process, such as, for example, during flip chip bonding where substrate flatness and rigidity are required. To address the above issue, the prior art sometimes provides substrates that may have a thickness of at least several tens of microns or more. However, the above measure disadvantageously detracts from further package size minimization.

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
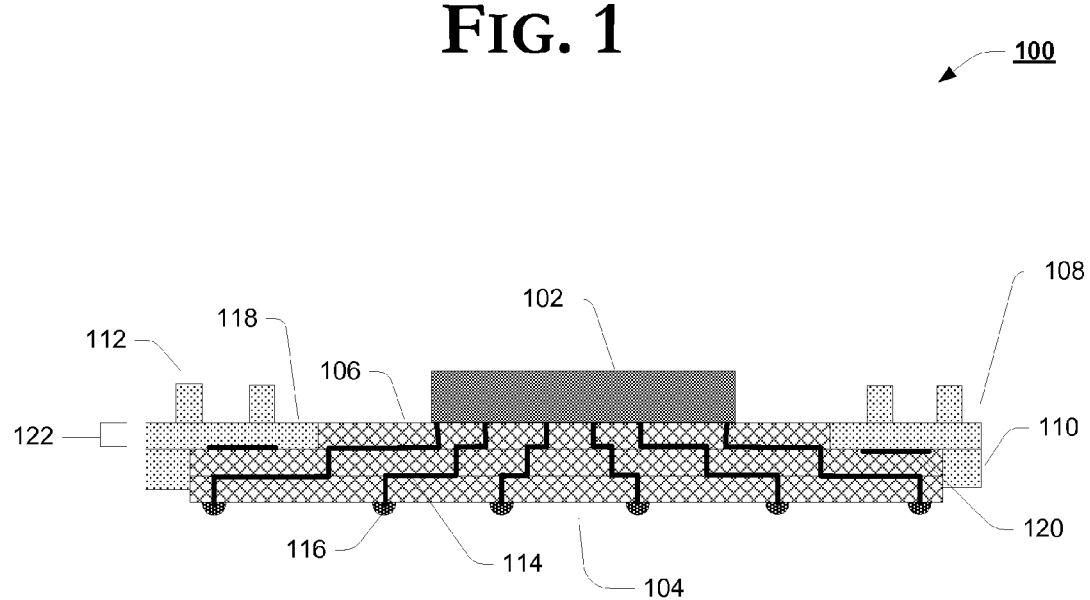
FIG. 1 is a graphical illustration of a cross-sectional view of an example microelectronic device package including an injection molded metal stiffener, in accordance with one example embodiment of the invention.

FIG. 1 is a graphical illustration of a cross-sectional view of an example microelectronic device package including an injection molded metal stiffener, in accordance with one example embodiment of the invention. As shown, integrated circuit package 100 includes one or more of microelectronic device 102, package substrate 104, substrate top surface 106, injection molded metal stiffener 108, stiffener overhang 110, stiffener rib 112, conductive traces 114, conductive contacts 116, stiffener top surface 118, substrate copper pad 120 and stiffener height 122.

Microelectronic device 102 is intended to represent any type of integrated circuit die. In one embodiment, microelectronic device 102 is a multi-core microprocessor. Microelectronic device 102 includes an active surface which contains the electrical connections that couple with conductive traces 114 at substrate top surface 106.

Package substrate 104 represents any type of microelectronic device package substrate. In one embodiment, package substrate 104 represents a multi-layer organic substrate. In one embodiment, conductive traces 114 conductively couple microelectronic device 102 on substrate top surface 106 through build up layers to conductive contacts 116. Conductive contacts 116 couple with conductive traces 114 and allow integrated circuit package 100 to be electrically coupled, for example by a socket connection, to a circuit board. In one embodiment, conductive contacts 116 include solder bumps. In another embodiment, conductive contacts 116 include lands.

Injection molded metal stiffener 108 is attached to package substrate 104 to provide stiffening, which one skilled in the art would recognize may be essential for very thin packages. The mold used to create injection molded metal stiffener 108 may include features such as stiffener overhang 110, which may be designed to extend along one or more side(s) of package substrate 104, and/or stiffener rib 112, which may be designed to extend vertically up from injection molded metal stiffener 108.

In one embodiment, injection molded metal stiffener 108 is composed substantially of magnesium. In other embodiments, injection molded metal stiffener 108 may be composed of magnesium-zinc, magnesium-aluminum, or other magnesium or aluminum or zinc alloys. In one embodiment, the metal used to mold injection molded metal stiffener 108 is chosen for thixotropic properties, such that when heated near its melting point and shear forces are applied, the metal may have viscous or plastic-like flow properties.

In one embodiment, stiffener top surface 118 is substantially flush with substrate top surface 106, though in other embodiments, stiffener top surface 118 may be extend above or below substrate top surface 106. Injection molded metal stiffener 108 may be coupled with package substrate 104 before or after or contemporaneous to microelectronic device 102 is coupled with package substrate 104. Package substrate 104 may include copper pad 120 through which injection molded metal stiffener 108 is soldered to package substrate 104. In another embodiment, a polymer adhesive is used to bond injection molded metal stiffener 108 with package substrate 104. Injection molded metal stiffener 108 may have a stiffener height 122 of a little as about 12 mils.

Figure 2:
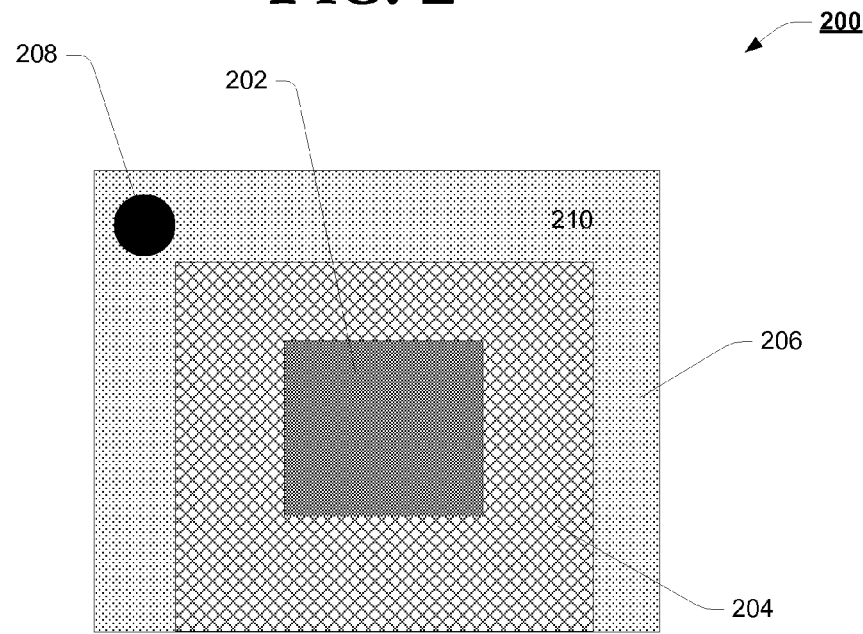
FIG. 2 is a graphical illustration of an overhead view of an example microelectronic device package including an injection molded metal stiffener, in accordance with one example embodiment of the invention.

FIG. 2 is a graphical illustration of an overhead view of an example microelectronic device package including an injection molded metal stiffener, in accordance with one example embodiment of the invention. As shown, integrated circuit package 200 includes one or more of microelectronic device 202, package substrate 204, injection molded metal stiffener 206, stiffener hole 208 and package marking 210.

Injection molded metal stiffener 206 may include a central opening and at least partially surrounds microelectronic device 202. While shown as bordering three sides of microelectronic device 202, injection molded metal stiffener 206 may border more or fewer sides of microelectronic device 202. Injection molded metal stiffener 206 may also incorporate, either as part of the mold or through further processing, stiffener hole 208, which may be used for handling package 200, and/or package marking 210, which may identify package 200.

Figure 3:
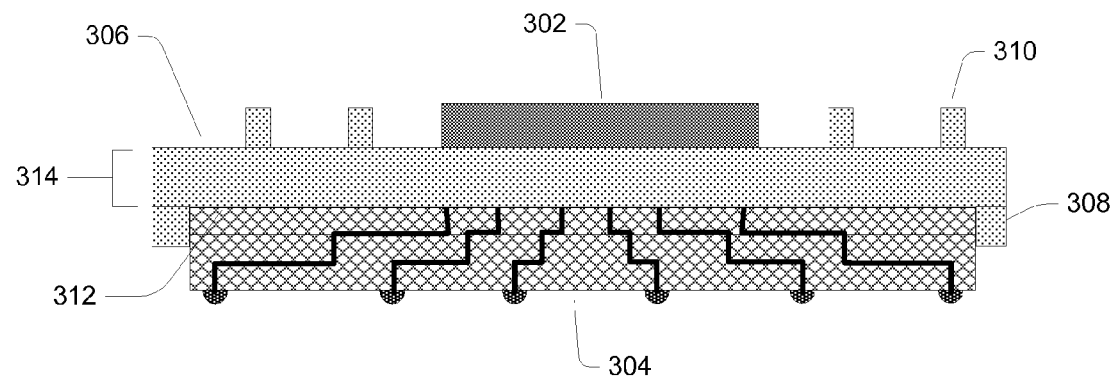
FIG. 3 is a graphical illustration of a cross-sectional view of another example microelectronic device package including an injection molded metal stiffener, in accordance with one example embodiment of the invention.

FIG. 3 is a graphical illustration of a cross-sectional view of another example microelectronic device package including an injection molded metal stiffener, in accordance with one example embodiment of the invention. As shown, integrated circuit package 300 includes one or more of microelectronic device 302, package substrate 304, injection molded metal stiffener 306, stiffener overhang 308, stiffener rib 310, substrate top surface 312, and stiffener height 314.

Package substrate 304 may represent a bump-less build up layer substrate. In one embodiment, microelectronic device 302 and injection molded metal stiffener 306 are placed on a holding plate while encapsulation material is disposed between them forming a bond. Substrate top surface 312 may then be formed under the device and stiffener combination, followed by subsequent substrate layers.

While shown as including stiffener overhang 308 and stiffener rib 310, injection molded metal stiffener 306 may be formed without one or both of these features. In one embodiment, stiffener height 314 is substantially equal to the height of microelectronic device 302.

Figure 4:
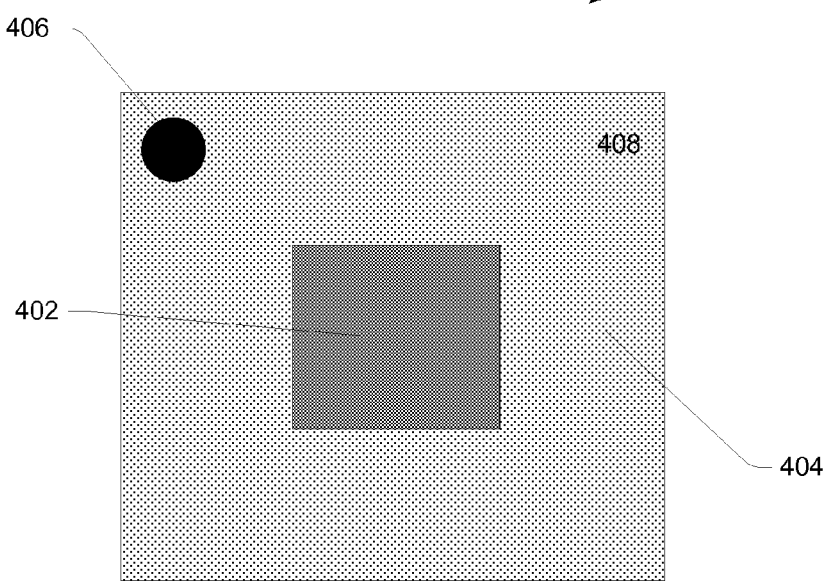
FIG. 4 is a graphical illustration of an overhead view of another example microelectronic device package including an injection molded metal stiffener, in accordance with one example embodiment of the invention.

FIG. 4 is a graphical illustration of an overhead view of another example microelectronic device package including an injection molded metal stiffener, in accordance with one example embodiment of the invention. As shown, integrated circuit package 400 includes one or more of microelectronic device 402, injection molded metal stiffener 404, stiffener hole 406 and package marking 408.

Injection molded metal stiffener 404 may include a central opening and at least partially surrounds microelectronic device 402. While shown as being adjacent to all four sides of microelectronic device 402, injection molded metal stiffener 404 may be adjacent to fewer than all sides of microelectronic device 402.

Figure 5:
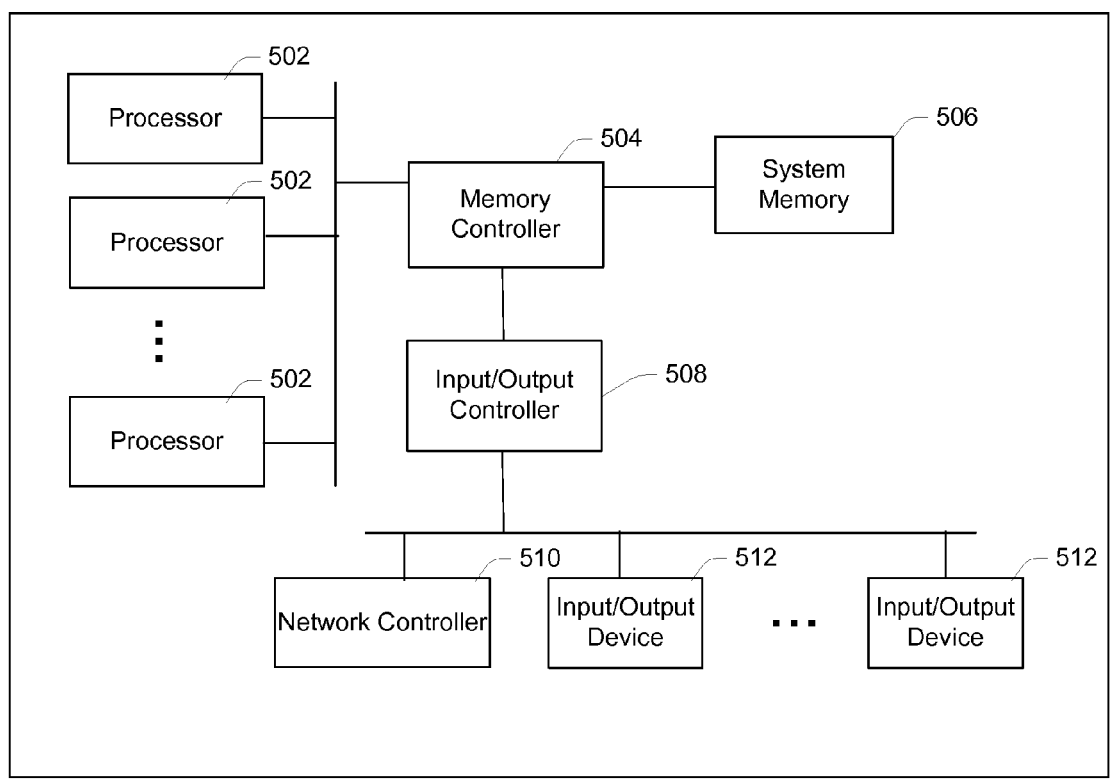
FIG. 5 is a block diagram of an example electronic appliance suitable for implementing a microelectronic device package including an injection molded metal stiffener, in accordance with one example embodiment of the invention.

FIG. 5 is a block diagram of an example electronic appliance suitable for implementing a microelectronic device package including an injection molded metal stiffener, in accordance with one example embodiment of the invention. Electronic appliance 500 is intended to represent any of a wide variety of traditional and non-traditional electronic appliances, laptops, desktops, cell phones, wireless communication subscriber units, wireless communication telephony infrastructure elements, personal digital assistants, set-top boxes, or any electric appliance that would benefit from the teachings of the present invention. In accordance with the illustrated example embodiment, electronic appliance 500 may include one or more of processor(s) 502, memory controller 504, system memory 506, input/output controller 508, network controller 510, and input/output device(s) 512 coupled as shown in FIG. 5. Processor(s) 502, or other integrated circuit components of electronic appliance 500, may comprise a microelectronic device package including an injection molded metal stiffener as described previously as an embodiment of the present invention.

Processor(s) 502 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect. In one embodiment, processors(s) 502 are Intel® compatible processors. Processor(s) 502 may have an instruction set containing a plurality of machine level instructions that may be invoked, for example by an application or operating system.

Memory controller 504 may represent any type of chipset or control logic that interfaces system memory 506 with the other components of electronic appliance 500. In one embodiment, the connection between processor(s) 502 and memory controller 504 may be a point-to-point serial link. In another embodiment, memory controller 504 may be referred to as a north bridge.

System memory 506 may represent any type of memory device(s) used to store data and instructions that may have been or will be used by processor(s) 502. Typically, though the invention is not limited in this respect, system memory 506 will consist of dynamic random access memory (DRAM). In one embodiment, system memory 506 may consist of Rambus DRAM (RDRAM). In another embodiment, system memory 506 may consist of double data rate synchronous DRAM (DDRSDRAM).

Input/output (I/O) controller 508 may represent any type of chipset or control logic that interfaces I/O device(s) 512 with the other components of electronic appliance 500. In one embodiment, I/O controller 508 may be referred to as a south bridge. In another embodiment, I/O controller 508 may comply with the Peripheral Component Interconnect (PCI) Express™ Base Specification, Revision 1.0a, PCI Special Interest Group, released Apr. 15, 2003.

Network controller 510 may represent any type of device that allows electronic appliance 500 to communicate with other electronic appliances or devices. In one embodiment, network controller 510 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 510 may be an Ethernet network interface card.

Input/output (I/O) device(s) 512 may represent any type of device, peripheral or component that provides input to or processes output from electronic appliance 500.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. An apparatus comprising:
   one and only one microelectronic device package substrate, wherein the package substrate comprises a multilayer organic substrate;
   a microelectronic device coupled with a top surface of the package substrate; and
   an injection-molded, metal stiffener coupled with the package substrate, wherein the stiffener includes a central opening and only partially surrounds the microelectronic device, wherein the stiffener further comprises a rib that extends vertically up from the stiffener.

2. The apparatus of claim 1, wherein the stiffener comprises magnesium.

3. The apparatus of claim 1, wherein a top surface of the stiffener is substantially flush with the top surface of the package substrate.

4. The apparatus of claim 1, wherein the stiffener is coupled with a copper pad on the package substrate.

5. The apparatus of claim 1, further comprising a marking on a top surface of the stiffener.

6. An electronic appliance comprising:
   a network controller;
   a system memory; and
   a processor, wherein said processor comprises:
     one and only one microelectronic device package substrate;
     a microelectronic device coupled with a top surface of the package substrate; and
     an injection-molded, metal stiffener coupled with the package substrate, wherein the stiffener includes a central opening and only partially surrounds the microelectronic device, wherein the stiffener further comprises an overhang that extends along a side of the package substrate.

7. The electronic appliance of claim 6, wherein the stiffener further comprises a rib that extends vertically up from the stiffener.

8. The electronic appliance of claim 6, wherein the stiffener comprises magnesium-zinc alloy.

9. The electronic appliance of claim 6, wherein the stiffener comprises a height of about 12 mils.

10. The electronic appliance of claim 6, wherein the stiffener comprises magnesium-aluminum alloy.

11. An apparatus comprising:
    one and only one microelectronic device package substrate, wherein the package substrate comprises a bumpless build up layer substrate;
    a microelectronic device coupled with a top surface of the package substrate; and
    an injection-molded, metal stiffener coupled with the package substrate, wherein the stiffener includes a central opening and only partially surrounds the microelectronic device, wherein the stiffener further comprises an overhang that extends along a side of the package substrate.

12. The apparatus of claim 11, wherein the stiffener comprises zinc alloy.

13. The apparatus of claim 11, wherein the stiffener is in contact with the microelectronic device.

14. The apparatus of claim 11, further comprising a hole on a top surface of the stiffener.

* * * * *